(12) United States Patent
Yin et al.

(10) Patent No.: US 12,532,513 B2
(45) Date of Patent: Jan. 20, 2026

(54) METHOD OF FORMING TOP SELECT GATE TRENCHES

(71) Applicant: Yangtze Memory Technologies Co., Ltd., Hubei (CN)

(72) Inventors: Hang Yin, Wuhan (CN); Zhipeng Wu, Wuhan (CN); Kai Han, Wuhan (CN); Lu Zhang, Wuhan (CN); Pan Wang, Wuhan (CN); Xiangning Wang, Wuhan (CN); Hui Zhang, Wuhan (CN); Jingjing Geng, Wuhan (CN); Meng Xiao, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 18/667,449

(22) Filed: May 17, 2024

(65) Prior Publication Data
US 2024/0304693 A1 Sep. 12, 2024

Related U.S. Application Data

(60) Division of application No. 17/132,802, filed on Dec. 23, 2020, now Pat. No. 12,021,126, which is a
(Continued)

(51) Int. Cl.
*H10D 30/69* (2025.01)
*H10B 41/10* (2023.01)
(Continued)

(52) U.S. Cl.
CPC .......... *H10D 30/699* (2025.01); *H10B 41/10* (2023.02); *H10B 41/27* (2023.02); *H10B 41/35* (2023.02);
(Continued)

(58) Field of Classification Search
CPC ...... H10D 30/699; H10B 41/10; H10B 41/35; H10B 43/50
(Continued)

(56) References Cited

U.S. PATENT DOCUMENTS 9,343,475 B2  5/2016  Jang et al.
2015/0200203 A1  7/2015  Jang et al.
(Continued)

FOREIGN PATENT DOCUMENTS

CN  107731832 A  2/2018
CN  108962910 A  12/2018
(Continued)

OTHER PUBLICATIONS

International Search Report issued Jun. 9, 2021 in PCT/CN2020/114795, 5 pages.
(Continued)

*Primary Examiner* — Quoc D Hoang
(74) *Attorney, Agent, or Firm* — Oblon, McClelland, Maier & Neustadt, L.L.P.

(57) ABSTRACT

Aspects of the disclosure provide a method for fabricating a semiconductor device having an first stack of alternating insulating layers and sacrificial word line layers arranged over a substrate, the first stack including a core region and a staircase region. The method can include forming a first dielectric trench in the core region of the first stack, forming a second dielectric trench that is adjacent to and connected with the first dielectric trench in the staircase region of the first stack, and forming dummy channel structures extending through the first stack where the dummy channel structures are spaced apart from the second dielectric trench.

20 Claims, 4 Drawing Sheets

Related U.S. Application Data continuation of application No. PCT/CN2020/114795, filed on Sep. 11, 2020.

(51) Int. Cl.
    *H10B 41/27*     (2023.01)
    *H10B 41/35*     (2023.01)
    *H10B 43/10*     (2023.01)
    *H10B 43/27*     (2023.01)
    *H10B 43/35*     (2023.01)
    *H10D 30/01*     (2025.01)
    *H10D 30/68*     (2025.01)
    *H10D 64/01*     (2025.01)

(52) U.S. Cl.
    CPC ............. *H10B 43/10* (2023.02); *H10B 43/27* (2023.02); *H10B 43/35* (2023.02); *H10D 30/0411* (2025.01); *H10D 30/0413* (2025.01); *H10D 30/689* (2025.01); *H10D 30/6892* (2025.01); *H10D 30/6894* (2025.01); *H10D 30/693* (2025.01); *H10D 30/696* (2025.01); *H10D 64/017* (2025.01); *H10D 64/035* (2025.01); *H10D 64/037* (2025.01)

(58) Field of Classification Search
    USPC ........................................................ 257/314
    See application file for complete search history.

(56) References Cited

U.S. PATENT DOCUMENTS

2019/0214404 A1*   7/2019   Ahn ..................... H10B 43/35
2019/0326319 A1    10/2019   Yun
2020/0194447 A1     6/2020   Sun et al.

FOREIGN PATENT DOCUMENTS

| | | |
|---|---|---|
| CN | 111211134 A | 5/2020 |
| CN | 111602244 A | 8/2020 |
| TW | 201947706 A | 12/2019 |
| TW | 1698001 B | 7/2020 |

OTHER PUBLICATIONS

Combined Office Action and Search Report issued on Jul. 8, 2025 in the corresponding Chinese Application No. 202080002425.X (with English translation of Category of Cited Documents), 10 pages.

\* cited by examiner

METHOD OF FORMING TOP SELECT GATE TRENCHES

RELATED APPLICATION

This application is a divisional of U.S. patent application Ser. No. 17/132,802 filed on Dec. 23, 2020, which is a bypass continuation of International Application No. PCT/CN2020/114795, filed on Sep. 11, 2020. The entire contents of the above-identified applications are incorporated herein by reference in their entirety.

TECHNICAL FIELD

The present application describes embodiments generally related to semiconductor memory devices.

BACKGROUND

Flash memory devices are widely used for electronic data storage in various modern technologies, e.g., smart phones, computers, and the like. To increase memory density and reduce fabrication cost, three-dimensional (3D) NAND flash memory devices have been developed. As 3D NAND technology moves towards higher density and higher capacity, for example going from 128 layers to 192 layers, high-aspect-ratio etching and subsequent filling can become increasingly difficult. Particularly, in a channel-first fabrication scheme, a top select gate (TSG) trench pattern is usually printed on a single photomask. The considerable depth of TSG trenches can render etching and filling a challenging task. Despite efforts to mitigate the problem by adding holes to TSG trenches, the etching profile may be deformed, and crack defects may be formed during a later thermal process.

SUMMARY

Aspects of the disclosure provide a semiconductor device with a TSG trench that is printed in two photomasks and the method of forming the semiconductor device with the TSG trench.

According to a first aspect, a semiconductor device is provided. The semiconductor device can include a first stack of alternating insulating layers and word line layers over a substrate, where the first stack can include a core region and a staircase region, and the word line layers can include a TSG. In some embodiments, the word line layers further include one or more dummy TSGs below the TSG. In some embodiments, the word line layers may further include gate lines below the dummy TSGs, one or more bottom select gates (BSGs) below the gate lines, and a BSG below the one or more dummy BSGs.

The semiconductor device can also include first channel structures in the core region of the first stack and dummy channel structures that extend through the first stack. Further, the first channel structures extend through the core region of the first stack. For example, a first channel structure can include a channel layer surrounded by one or more insulating layers. Additionally, the dummy channel structures are formed in at least one of the core region and the staircase region of the first stack.

The semiconductor device can further include a first TSG cut structure in the core region and a second TSG cut structure in the staircase region. The first TSG cut structure are adjacent to and connected with the second TSG cut structure. Both the first TSG cut structure and the second TSG cut structure extend through the TSG and divide the TSG into sub-TSGs. In some embodiments, both the first TSG cut structure and the second TSG cut structure extend through the one or more dummy TSGs and divide the one or more dummy TSGs into dummy sub-TSGs. Further, the first TSG cut structure can be made of a different dielectric material from or a same dielectric material as the second TSG cut structure. The first TSG cut structure can have a different depth from or a same depth as the second TSG cut structure.

In other embodiments, the semiconductor device can include a second stack of alternating insulating layers and word line layers, and the second stack is sandwiched between the substrate and the first stack. The second stack can include second channel structures in a core region of the second stack, and the second channel structures extend through the core region of the second stack and are aligned with corresponding first channel structures.

According to a second aspect of the disclosure, a method for fabricating a semiconductor device is provided, where the semiconductor device has a first stack of alternating insulating layers and sacrificial word line layers arranged over a substrate, the first stack including a core region and a staircase region. The method can include forming a first dielectric trench in the core region of the first stack, forming a second dielectric trench, adjacent to and connected with the first dielectric trench, in the staircase region of the first stack, and forming dummy channel structures extending through the first stack where the dummy channel structures are spaced apart from the second dielectric trench.

In some embodiments, forming the first dielectric trench in the core region of the first stack can be accomplished by etching, based on a first mask, one or more pairs of the alternating insulating layers and sacrificial word layers in the core region of the first stack to form a first empty trench, and filling the first empty trench with a first dielectric material. Forming the second dielectric trench in the staircase region of the first stack can be accomplished by etching, based on a second mask, one or more pairs of the alternating insulating layers and sacrificial word layers in the staircase region of the first stack to form a second empty trench adjacent to the first empty trench that has been filled with the first dielectric material, and filling the second empty trench with a second dielectric material. The first dielectric material can be the same as or different from the second dielectric material. Further, forming dummy channel structures extending through the first stack can be accomplished by etching, based on a third mask, through the first stack to form dummy channel holes, and filling the dummy channel holes with a third dielectric material. The dummy channel structures are formed in at least one of the core region and the staircase region of the first stack. In some embodiments, forming the second dielectric trench can further include forming a marker over the substrate using the second mask that contains patterns of the marker and the second dielectric trench. The marker can be used for future alignment.

The method can also include forming a gate line cut trench that extend through the first stack and replacing the sacrificial word line layer with word line layers. The gate line cut trench can extend in a same direction as the first dielectric trench and the second dielectric trench and divide the first stack into first substacks. In some embodiments, the word line layers include a TSG at the top of the first stack, and the first and second dielectric trenches extend through the TSG and divide the TSG into sub-TSGs. In some embodiments, the word line layers may further include one or more dummy TSGs below the TSG, and the first and second dielectric trenches may further extend through the one or more dummy TSGs and divide the one or more dummy TSGs into dummy sub-TSGs.

In some embodiments, prior to forming the second dielectric trench, the method can include forming first channel structures in the core region of the first stack, where the first channel structures extend through the core region of the first stack, and forming the staircase region of the first stack. For example, the first channel structure can include a channel layer surrounded by one or more insulating layers.

In some embodiments, prior to forming the first stack of alternating insulating layers and sacrificial word layers over the substrate, the method may include forming a second stack of alternating insulating layers and sacrificial word layers over the substrate, where the second stack is sandwiched between the first stack and the substrate, and forming second channel structures in the core region of the second stack, where the second channel structures extend through the core region of the second stack and are aligned with corresponding first channel structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1A:
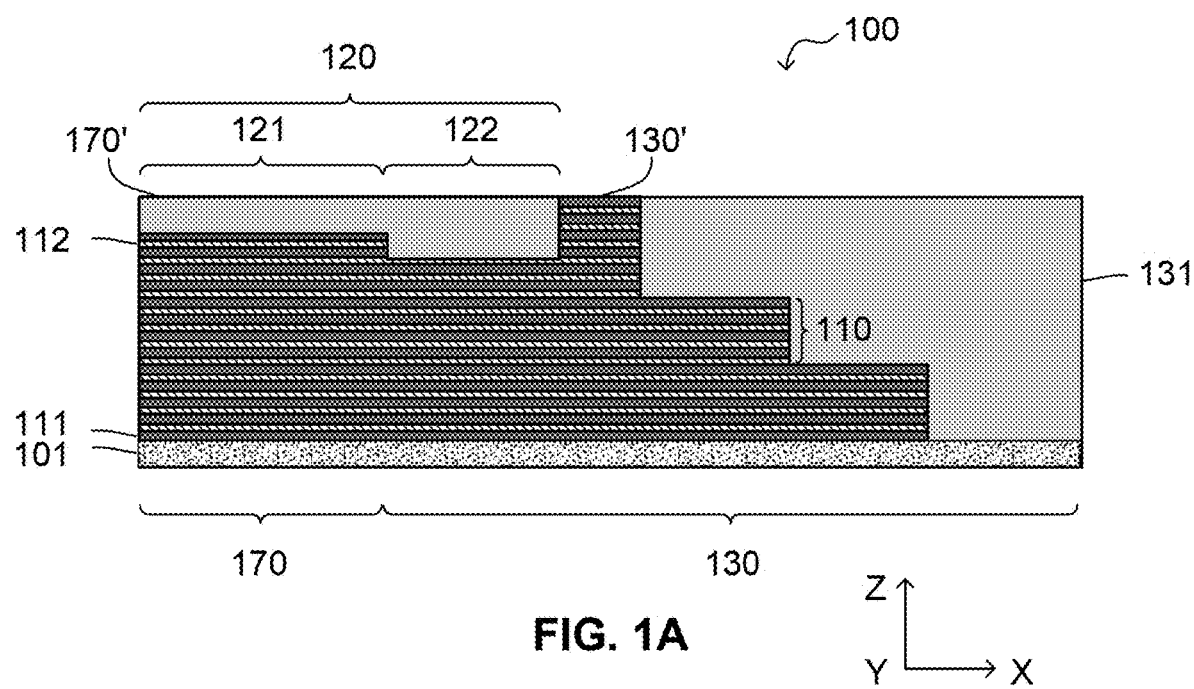
FIGS. 1A and 1B show a cross-sectional view and a top-down view, respectively, of a semiconductor device in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a method of forming a top select gate (TSG) trench using two photomasks. The method can include forming a first dielectric trench, channel structures, a staircase, a second dielectric trench, and dummy channel structures, sequentially. According to an aspect of the disclosure, the disclosed method can achieve various benefits over a related example. For instance, the related example usually adds holes to a TSG trench to facilitate the trench filling process, but the added holes will inevitably make etching more difficult. Moreover, crack defects may be formed during a later thermal process. The present disclosure can circumvent the etching and filling problem by splitting the TSG trench onto two photomasks and forming one portion of the TSG trench at a step. The resultant TSG trench does not have to extend though all the word line layers and can endure the thermal process without crack formation.

FIG. 1A is a cross-sectional view of a semiconductor device 100, in accordance with exemplary embodiments of the disclosure. As shown, the device 100 can include a stack of alternating insulating layers 111 and word line layers 112 (also referred to as gate layers) that are arranged in a vertical direction over a substrate 101. The insulating layers 111 can be made of insulating material(s), such as silicon nitride, silicon dioxide, and the like. The word line layers 112 can be made of gate stack materials, such as high dielectric constant (high-k) gate insulator layers, metal gate electrode, and the like.

The device 100 can further include a core region 170 and a staircase region 130. The core region 170 includes a plurality of channel structures (not shown, but will be explained in detail in FIG. 1B) that extend through the stack in the vertical direction. The stack of alternating insulating layers 111 and word line layers 112 along with the channel structures can form a stack of transistors, such as an array of vertical memory cell strings. In some examples, the stack of transistors can include memory cells and select transistors, such as one or more bottom select transistors, one or more top select transistors, and the like. In some examples, the stack of transistors can also include one or more dummy select transistors. Accordingly, the word line layers 112 can include one or more top select gates (TSGs) and may further include one or more dummy TSGs below the TSGs.

As shown, the staircase region 130 includes a plurality of stair steps 110 that are formed of one or more pairs of alternating insulating layers 111 and word line layers 112. For example, the stair step 110 is demonstrated to have four pairs of alternating insulating layers 111 and word line layers 112 in FIG. 1A. The staircase region 130 can also have an insulating layer 131 over the stair steps 110. Additionally, a top surface of the staircase region 130' can be on a same level as a top surface of the core region 170'. In some embodiments, top surfaces of the channel structures (not shown) are on the same level as the top surface of the core region 170'.

Still in FIG. 1A, the device can include a TSG trench 120 having a first TSG cut structure 121 in the core region 170 and a second TSG cut structure 122 in the staircase region 130. The first TSG cut structure 121 is made of a same dielectric material (e.g., silicon oxide) as the second TSG cut structure 122 in the FIG. 1A example. The first TSG cut structure 121 and the second TSG cut structure 122 are formed in separate steps and can therefore have different depths as illustrated. Of course, the first TSG cut structure 121 and the second TSG cut structure 122 can also have the same depth. Alternatively, the first TSG cut structure 121 can be made of a different dielectric material from the second TSG cut structure 122.

Figure 1B:
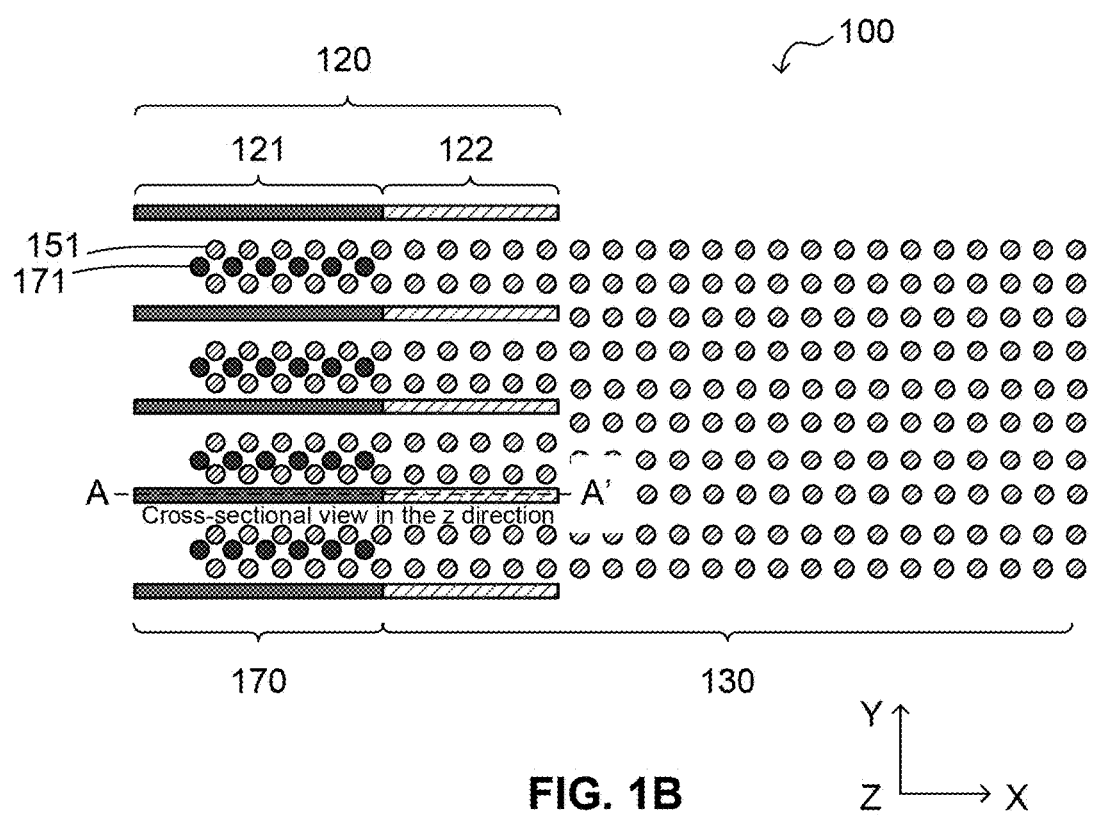

Further, the device 100 can include a plurality of dummy channel structures (not shown) extending through the stack, which be explained in detail in FIG. 1B.

FIG. 1B is a top-down view of the device 100, where the cross-sectional view of the device 100 in FIG. 1A is taken along the line cut AA' in the z direction, in an embodiment where the first TSG cut structure 121 is made of the same material as the second TSG cut structure 122. As shown, the device 100 can include a core region 170 and a staircase region 130. In some embodiments, the device may include more than one staircase region 130. Moreover, the device 100 can have various staircase configurations, such as center staircase implementation, side staircase implementation, and the like.

The device 100 can also include one or more of the TSG trenches 120 that extend along the x direction. Again, the TSG trench 120 includes the first TSG cut structure 121 in the core region 170 and the second TSG cut structure 122 in the staircase region 130. While the device 100 is shown to include five TSG trenches 120 in the FIG. 1B example, it should be understood that the device 100 can include any number of TSG trenches 120 to meet specific design requirements.

In an embodiment where the stack includes one or more TSGs as mentioned above, the TSG trench 120 extends through the one or more TSGs and divides the one or more TSGs into sub-TSGs. In another embodiment where the stack further includes one or more dummy TSGs below the TSG(s), the TSG trench 120 further extends through the one or more dummy TSGs and divides the one or more dummy TSGs into dummy sub-TSGs. For example, the stack can have a TSG and three dummy TSGs so the TSG trench 120 extends through at least four pairs of alternating insulating layers and word line layers to divide the TSG and three dummy TSGs into sub-TSGs and dummy sub-TSGs.

The device 100 can further include a plurality of dummy channel structures 151 in the core region 170 and the staircase region 130. In the core region 170, the dummy channel structures 151 can extend through the TSG(s), the dummy TSG(s), the word lines, the dummy bottom select gates BSG(s), and the BSG(s), and may further extend into the substrate (not shown). In the staircase region 130, the dummy channel structures 151 can extend through corresponding word lines, the dummy BSG(s), and the BSG(s), and may further extend into the substrate (not shown). The dummy channel structures 151 can serve as mechanical components to support the stack when sacrificial word lines are removed during manufacturing. For example, the dummy channel structures 151 can be made of a same dielectric material as the TSG trenches 120. Note that in some embodiments, the dummy channel structures 151 can be selectively formed only in the core region 170 or only in the staircase region 130.

As mentioned earlier in FIG. 1A, the device 100 also includes a plurality of channel structures 171 in the core region 170. The channel structure 171 can include a channel layer (e.g., polysilicon), surrounded by one or more insulating layers, such as a tunneling layer (e.g., silicon oxide), a charge trapping layer (e.g., silicon nitride), and a barrier layer (e.g., silicon oxide) that together form an oxide-nitride-oxide structure surrounding the channel layer. The channel structures 171 can be used to form a stack of transistors, and the descriptions have been provided above and will be omitted here.

While the dummy channel structures 151 and channel structures 171 in the FIG. 1B example are shown as circular dots aligned in arrays of parallel lines, the dummy channel structures 151 and channel structures 171 can have any suitable array shape, such as a matrix array shape along the x direction and the y direction, a zig-zag array shape along the x or y direction, a beehive (e.g., hexagonal) array shape, and the like. The dummy channel structures 151 and channel structures 171 can also have any suitable shape, such as a rectangular shape in the x-y plane, and a pillar shape in the x-z plane and y-z plane. Additionally, the device 100 can have a plurality of contact structures (not shown) that extend through the insulating layer 131 in the staircase region 130. The plurality of contact structures can be electrically connected to respective word line layers 112.

FIGS. 2-5 are cross-sectional views of a semiconductor device 200 at various intermediate steps of manufacturing, in accordance with exemplary embodiments of the disclosure. The device 200 can refer to any suitable device, for example, memory circuits, a semiconductor chip (or die) with memory circuits formed on the semiconductor chip, a semiconductor wafer with multiple semiconductor dies formed on the semiconductor wafer, a stack of semiconductor chips, a semiconductor package that includes one or more semiconductor chips assembled on a package substrate, and the like.

Figure 2:
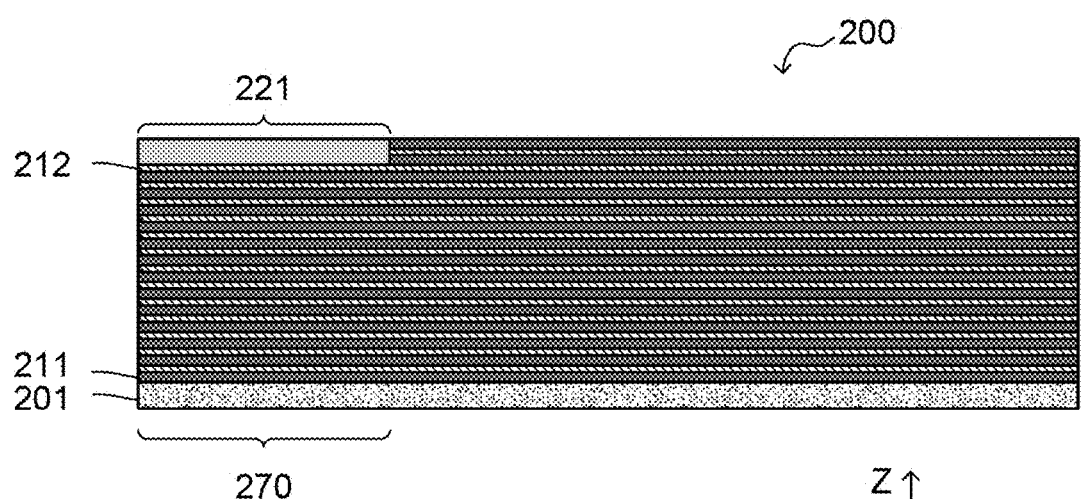
FIGS. 2-5 are cross-sectional views of a semiconductor device at various intermediate steps of manufacturing, in accordance with exemplary embodiments of the disclosure.

FIG. 2 shows a cross-sectional view of the semiconductor device 200 that will eventually become the device 100. As shown, the device 200 includes a substrate 201, such as a silicon (Si) substrate in this example. The substrate 201 can also be any other suitable substrate, such as a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate 201 may be a bulk wafer or an epitaxial layer.

A stack of alternating insulating layers 211 and sacrificial word lines 212 can be formed in a stack vertically over the substrate 201. The insulating layers 211 correspond to the insulating layers 111 in FIG. 1A. The sacrificial word line layers 212 will eventually be replaced by the word line layers 112 in FIG. 1A. The sacrificial word line layers 212 can be made of a different material from the insulating layers 211 (e.g., silicon oxide), such as silicon nitride.

Still in FIG. 2, a first dielectric trench 221 that extends along the x direction can be formed in a core region 270 of the stack. Firstly, one or more pairs of alternating insulating layers 211 and sacrificial word line layers 212 can be removed by etching based on a mask. Secondly, a dielectric material, such as silicon oxide, can be deposited to fill space of the removed insulating layers 211 and sacrificial word line layers 212. As a result, a depth of the first dielectric trench 221 can be controlled by etching and may vary depending on specific applications.

Similar to the device 100, a plurality of channel structures (not shown) can be formed in the core region 270. The plurality of channel structures of the device 200 corresponds to the plurality of channel structures 171 of the device 100. For simplicity, the descriptions have been provided above and will be omitted here, except that an array of vertical memory cell strings can be formed and that the word line layers 212 can include one or more TSGs and one or more dummy TSGs after the sacrificial word line layers 212 are replaced by word line layers.

Figure 3:
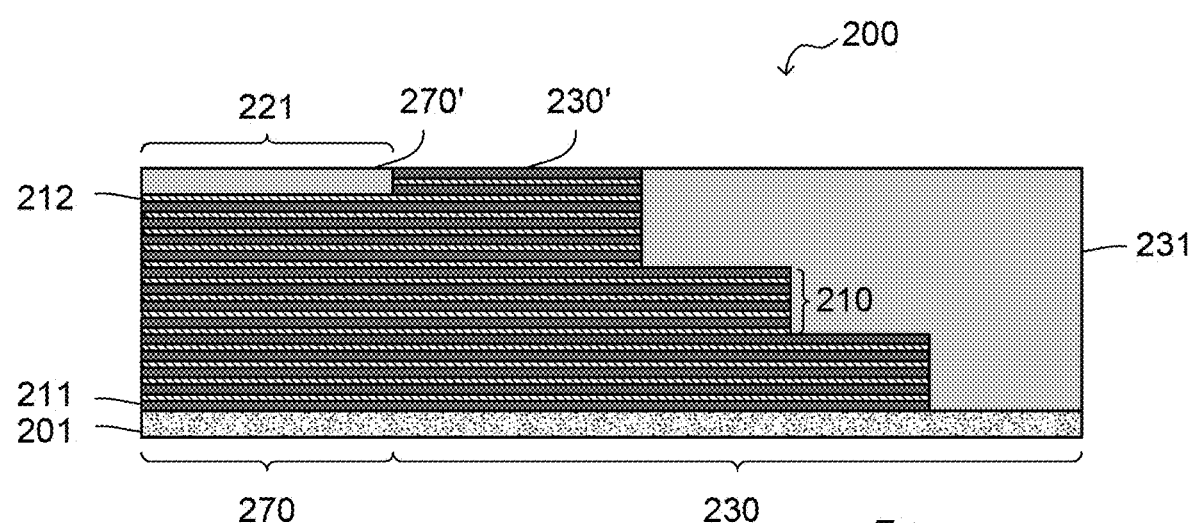

In FIG. 3, a staircase region 230 that is adjacent to the core region 270 is formed in the stack. The staircase region 230 can have a plurality of stair steps 210 that include one or more pairs of alternating insulating layers 211 and word line layers 212. For example, the stair step 210 in the FIG. 3 example has four pairs of alternating insulating layers 211 and word line layers 212. Additionally, a top surface of the staircase region 230' can be on a same level as a top surface of the core region 270'. In this example, top surfaces of the channel structures (not shown) are on the same level as the top surface of the core region 270'.

The staircase region 230 can be formed by a trim-and-etch approach. To begin with, a patterned mask can be formed over the stack so that the patterned mask exposes an end portion of the stack (not shown). The mask can, for example, include an amorphous carbon hard-mask layer, a dielectric anti-reflective coating, a bottom anti-reflective coating layer, and a photoresist layer. Then, a first plasma etching process that is well controlled by an etching time or end point traces can be performed to precisely remove the exposed end portion of first four pairs of the insulating layers 211 and the sacrificial word line layers 212. Next, a trim process can be applied to remove an end portion of the mask to expose the stack more.

Subsequently, a second etching process can be performed to precisely remove the exposed end portions of first four pairs and second four pairs of the insulating layers 211 and the sacrificial word line layers 212. The mask can then be trimmed again, and a third etching process can be performed. Therefore, the staircase region 230 can be formed by a multi-cycle trim-and-etch process.

It should be understood that more than one mask may be needed for the trim-and-etch approach since an original thickness of the mask limits the number of times that the mask can be trimmed. Moreover, the device 200 can have various staircase configurations, such as center staircase implementation, side staircase implementation, and the like.

Finally, a planarized insulating layer 231 is formed over the stair steps 210. The planarized insulating layer 231 can be made of the same material as the first dielectric trench 221 (e.g., silicon oxide), and can, for example, be formed by a chemical vapor deposition process followed by a chemical-mechanical planarization process.

Figure 4:
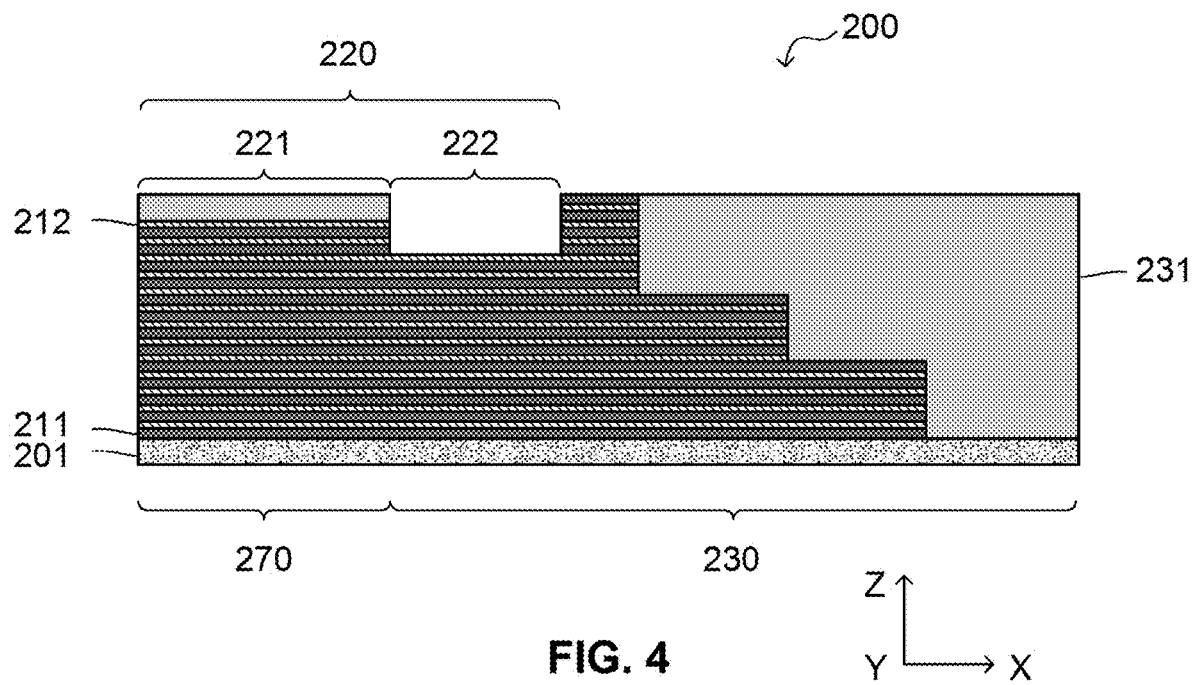

In FIG. 4, a second dielectric trench 222 can be formed. As shown, one or more pairs of alternating insulating layers 211 and sacrificial word line layers 212 can be removed by etching based on a mask. Similar to the first dielectric trench 221, a depth of the second dielectric trench 222 can be controlled by etching and may vary depending on specific applications. The first dielectric trench 221 can have a different depth from the second dielectric trench 222 as illustrated. Alternatively, the first dielectric trench 221 and the second dielectric trench 222 can have the same depth. In an example where the stack has a TSG and three dummy TSGs, the dielectric trenches 220 extends through at least four pairs of alternating insulating layers 211 and sacrificial word line layers 212 to divide the TSG and three dummy TSGs into sub-TSGs and dummy sub-TSGs. Additionally, while the second dielectric trench 222 is shown to be empty at this step in the FIG. 4 example, it can also be filled with a same dielectric material as or a different dielectric material from the first dielectric trench 221.

Still referring to FIG. 4, in some embodiments, a marker might also be formed over the substrate 201 so that the marker can be used for later alignment during manufacturing (not shown). Further, the marker and the second dielectric trench 222 can be printed on a same photomask and formed by a same etching and deposition process.

Figure 5:
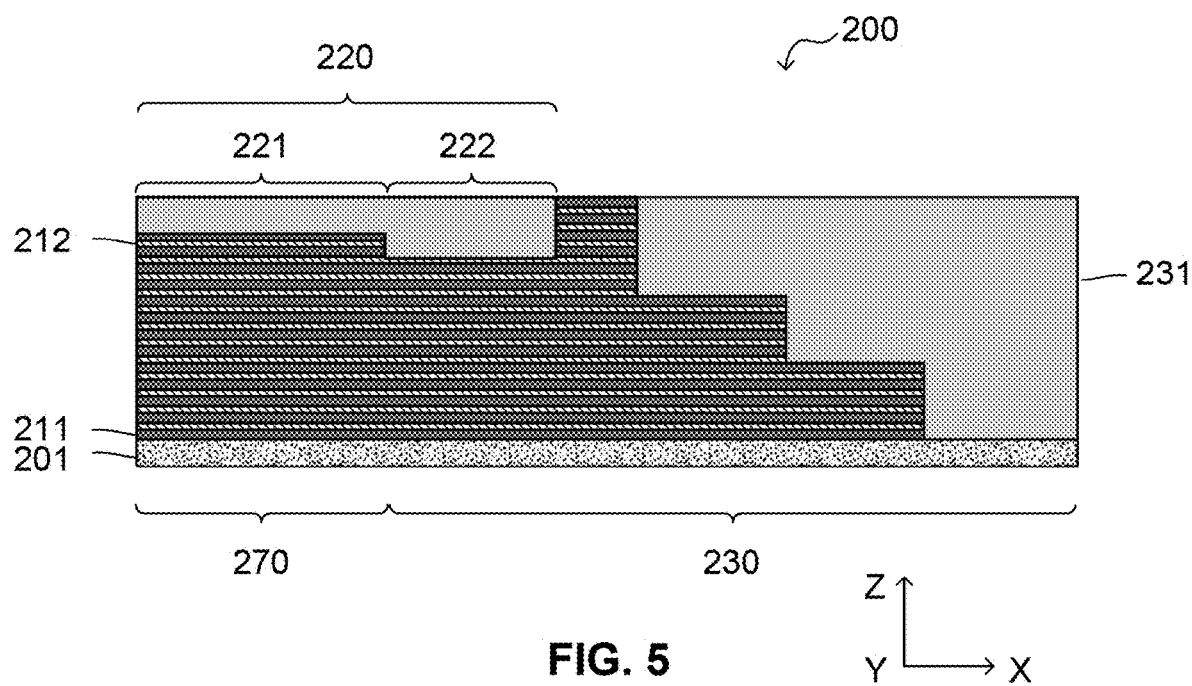

In FIG. 5, a plurality of dummy channel structures can be formed in the core region 270 and the staircase region 230 (not shown). Since the example embodiment of the dummy channel structures of the device 200 is similar to the example embodiment of the dummy channel structures 151 of the device 100 in FIG. 1B, explanation will be given with emphasis placed upon differences. For example, a deposition process can be performed to simultaneously fill the dummy channel structures and the second dielectric trench 222 with the same dielectric material as the first dielectric trench 221. In some embodiments, a dielectric material that is different from the first dielectric trench 221 may be deposited.

Figure 6:
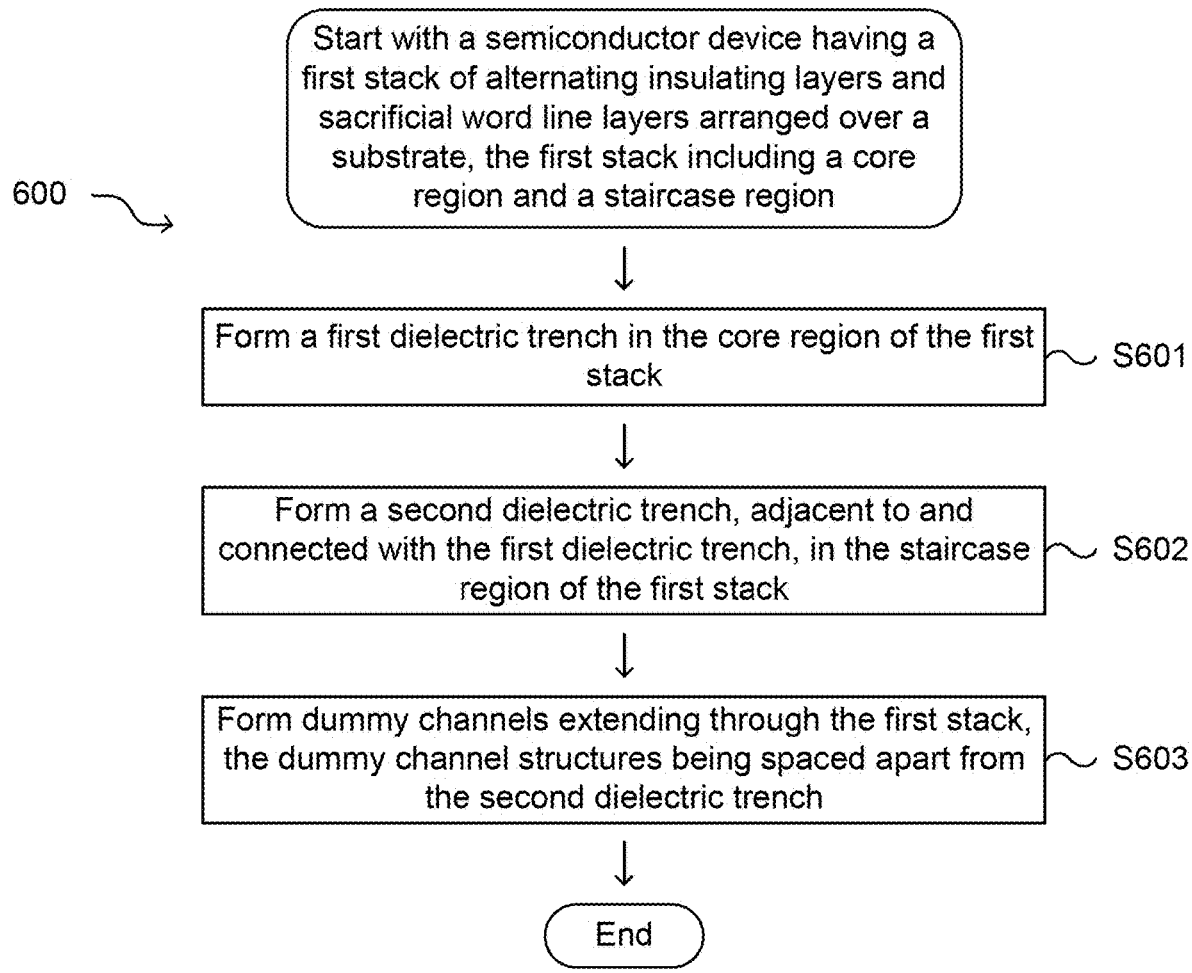
FIG. 6 is a flow chart of an exemplary process for manufacturing an exemplary semiconductor device, in accordance with embodiments of the disclosure.

FIG. 6 is a flow chart of an exemplary process 600 for manufacturing an exemplary semiconductor device, in accordance with embodiments of the disclosure. The process 600 starts with a semiconductor device that has a first stack of alternating insulating layers and sacrificial word line layers arranged over a substrate, where the first stack includes a core region and a staircase region. Note that the sacrificial word line layers will eventually be replaced by word line layers.

At step S601, a first dielectric trench can be formed in the core region of the first stack. One or more pairs of alternating insulating layers and sacrificial word line layers can be etched based on a mask, and the etch depth can be controlled by an etching time or end point traces. Then, a dielectric material, such as silicon oxide, can be deposited to fill space of the removed one or more pairs of insulating layers and sacrificial word line layers. A CMP process may further be needed to planarize the deposited dielectric material.

In some embodiments, a plurality of channel structures can then be formed in the stack. The channel structure can include a channel layer, surrounded by one or more insulating layers, such as a tunneling layer, a charge trapping layer, and a barrier layer. The plurality of channel structures and the stack of alternating insulating layers and word line layers can form a stack of transistors, such as an array of vertical memory cell strings. In some examples, the stack of transistors can include memory cells and select transistors, such as bottom select transistors and top select transistors, and may further include dummy select transistors. Accordingly, the word line layers can include one or more top select gates (TSGs) and may further include one or more dummy TSGs.

In some embodiments, a staircase region can be subsequently formed in the stack by a multi-cycle trim-and-etch process. The device can have various staircase configurations, such as center staircase implementation, side staircase implementation, and the like. Next, a planarized insulating layer can be formed over the staircase, and a plurality of contact structures that extend through the planarized insulating layer can be formed. The plurality of contact structures can be connected to respective sacrificial word line layers.

At step S602, a second dielectric trench that is adjacent to and connected with the first dielectric trench can be formed in the staircase region of the first stack. Similar to the first dielectric trench, the second dielectric trench can be formed by an etching and deposition process, and a depth of the second dielectric trench can be controlled by the etching process. As a result, the second dielectric trench can have a same depth as or a different depth from the first dielectric trench. Further, in an example where the word line layer include one or more TSGs and one or more dummy TSGs, the first and second dielectric trenches both extend through the TSGs and dummy TSGs and divide the TSGs and dummy TSGs into sub-TSGs and dummy sub-TSGs. Additionally, the second dielectric trench can be formed of a same dielectric material as the first dielectric trench.

At step S603, dummy channels that extend through the first stack can be formed in the core region and the staircase region. The dummy channel structures can serve as mechanical components to support the stack when sacrificial word lines are removed during manufacturing. The dummy channel structures can be made of a same dielectric material as the dielectric trench. In some embodiments, the dummy channel structures are formed only in the core region or only in the staircase region.

It should be noted that additional steps can be provided before, during, and after the process 600, and some of the steps described can be replaced, eliminated, or performed in a different order for additional embodiments of the process 600. For example, prior to step S601, a bottom stack of alternating insulating layers and sacrificial word line layers can be formed over the substrate, and an oxide layer can be formed over the bottom stack. The bottom stack can include a plurality of bottom channel structures extending through the bottom stack. Accordingly, the channel structures formed at step S601 will be aligned with respective bottom channel structures. In some embodiments, after step S603, a gate line cut trench that extends through the stack can be formed. The sacrificial word line layers can then be replaced by word line layers, and the gate line cut trench can be filled with an insulating material.

The various embodiments described herein offer several advantages. For example, in a related example, a TSG trench is printed in a single photomask, and the TSG trench usually extends through the stack. The disclosed method splits the TSG trench onto two separate photomasks and forms one dielectric trench of the TSG trench at a time. As a result, the depths of the two dielectric trenches can be individually tuned. In another related example where the second dielectric trench of the TSG trench is printed on a same photomask as the dummy channel structures, holes are usually added to a TSG trench to facilitate the trench filling process, and the TSG trench also extends through the stack. However, the added holes will inevitably make etching more difficult. In the disclosed method, the second dielectric trench of the TSG trench is printed on a different photomask from the dummy channel structures so that the TSG trench may only have to extend though a few pairs of alternating insulating layers and (sacrificial) word line layers, which reduces the complexity of the associated etching and filling process. Moreover, the TSG trench formed by the disclosed method can endure a thermal process without forming cracks, which is a common problem in related examples.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:
    forming a first dielectric trench in a core region of a first stack of alternating insulating layers and sacrificial word line layers, the first stack arranged over a substrate and including the core region and a staircase region;
    forming a second dielectric trench, adjacent to and connected with the first dielectric trench, in the staircase region of the first stack; and
    forming dummy channel structures extending through the first stack, the dummy channel structures being spaced apart from the second dielectric trench,
    wherein forming the first dielectric trench in the core region of the first stack further comprises etching, based on a first mask, one or more pairs of the alternating insulating layers and sacrificial word layers in the core region of the first stack to form a first empty trench and filling the first empty trench with a first dielectric material.

2. The method of claim 1, wherein forming the second dielectric trench in the staircase region of the first stack further comprises:
    etching, based on a second mask, one or more pairs of the alternating insulating layers and sacrificial word layers in the staircase region of the first stack to form a second empty trench adjacent to the first empty trench that has been filled with the first dielectric material; and
    filling the second empty trench with a second dielectric material.

3. The method of claim 2, wherein forming dummy channel structures extending through the first stack further comprises:
    etching, based on a third mask, through the first stack to form dummy channel holes; and
    filling the dummy channel holes with a third dielectric material.

4. The method of claim 2, wherein forming the second dielectric trench further comprises:
    forming a marker over the substrate using the second mask, the second mask containing patterns of the marker and the second dielectric trench, and the mask being used for future alignment.

5. The method of claim 2, wherein the first dielectric material is the same as or different from the second dielectric material.

6. The method of claim 1, wherein, prior to forming the second dielectric trench, the method further comprises:
    forming first channel structures in the core region of the first stack, the first channel structures extending through the core region of the first stack and including a channel layer surrounded by one or more insulating layers; and
    forming the staircase region of the first stack.

7. The method of claim 6, wherein, prior to forming the first stack of alternating insulating layers and sacrificial word layers over the substrate, the method further comprises:
    forming a second stack of alternating insulating layers and sacrificial word layers over the substrate, the second stack being sandwiched between the first stack and the substrate; and
    forming second channel structures in the core region of the second stack, the second channel structures extending through the core region of the second stack and aligned with corresponding first channel structures.

8. The method of claim 7, wherein the dummy channel structures extend through the second stack.

9. The method of claim 1, wherein the dummy channel structures are formed in at least one of the core region and the staircase region of the first stack.

10. The method of claim 1, wherein:
the first dielectric trench has a different depth from or a same depth as the second dielectric trench.

11. The method of claim 1, wherein:
the dummy channel structures are formed after the second dielectric trench is formed.

12. The method of claim 1, wherein:
the staircase region comprises a plurality of stair steps, the plurality of stair steps are formed by a trim-and-etch approach.

13. The method of claim 12, further comprising:
forming a planarized insulating layer over the plurality of stair steps.

14. The method of claim 13, further comprising:
forming a contact structure extending through the planarized insulating layer and in contact with the sacrificial word line layers.

15. A method for fabricating a semiconductor device, comprising:
forming a first dielectric trench in a core region of a first stack of alternating insulating layers and sacrificial word line layers, the first stack arranged over a substrate and including the core region and a staircase region;
forming a second dielectric trench, adjacent to and connected with the first dielectric trench, in the staircase region of the first stack;
forming dummy channel structures extending through the first stack, the dummy channel structures being spaced apart from the second dielectric trench;
forming a gate line cut trench that extend through the first stack, the gate line cut trench extending in a same direction as the first dielectric trench and the second dielectric trench and dividing the first stack into first substacks; and
replacing the sacrificial word line layer with word line layers.

16. The method of claim 15, wherein:
the word line layers include a top select gate (TSG) at the top of the first stack; and
the first and second dielectric trenches extend through the TSG and divides the TSG into sub-TSGs.

17. The method of claim 16, wherein:
the word line layers include one or more dummy TSGs below the TSG; and
the first and second dielectric trenches extend through the one or more dummy TSGs and divides the one or more dummy TSGs into dummy sub-TSGs.

18. The method of claim 17, wherein the word line layers further include gate lines below the dummy TSGs, one or more bottom select gates (BSGs) below the gate lines, and one or more dummy BSGs between the BSGs and the gate lines.

19. The method of claim 15, wherein each of the word line layers comprises a high dielectric constant gate insulator layer and a metal gate electrode.

20. A method for fabricating a semiconductor device, comprising:
forming a first dielectric trench in a core region of a first stack of alternating insulating layers and sacrificial word line layers, the first stack arranged over a substrate and including the core region and a staircase region;
forming a second dielectric trench, adjacent to and connected with the first dielectric trench, in the staircase region of the first stack; and
forming dummy channel structures extending through the first stack, the dummy channel structures being spaced apart from the second dielectric trench,
wherein the first dielectric trench and the second dielectric trench extend through a topmost sacrificial word line layer (TSWLL) of the first stack and divide the TSWLL into sub-TSWLLs.

* * * * *